(12) United States Patent
Bertness

(10) Patent No.: US 9,425,487 B2
(45) Date of Patent: Aug. 23, 2016

(54) MONITOR FOR FRONT TERMINAL BATTERIES

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 207 days.

(21) Appl. No.: 13/037,641

(22) Filed: Mar. 1, 2011

(65) Prior Publication Data

US 2011/0218747 A1    Sep. 8, 2011

Related U.S. Application Data

(60) Provisional application No. 61/309,977, filed on Mar. 3, 2010.

(51) Int. Cl.
*G01R 31/36* (2006.01)
*H01M 10/42* (2006.01)

(52) U.S. Cl.
CPC ...... *H01M 10/4207* (2013.01); *H01M 10/4285* (2013.01); *G01R 31/3627* (2013.01)

(58) Field of Classification Search
CPC ...... G01R 31/36; G01R 31/3627; H01R 4/30; G01N 27/416; H02J 7/00; H01M 10/4285; H01M 10/4207
USPC ............................................. 702/63; 320/103
See application file for complete search history.

(56) References Cited

U.S. PATENT DOCUMENTS

| 85,553 | A | 1/1869 | Adams | 33/472 |
|---|---|---|---|---|
| 2,000,665 | A | 5/1935 | Neal | 439/440 |
| 2,417,940 | A | 3/1947 | Lehman | 200/61.25 |
| 2,437,772 | A | 3/1948 | Wall | 324/523 |
| 2,514,745 | A | 7/1950 | Dalzell | 324/115 |
| 2,727,221 | A | 12/1955 | Springg | 340/447 |
| 3,025,455 | A | 3/1962 | Jonsson | 323/369 |
| 3,178,686 | A | 4/1965 | Mills | 340/447 |
| 3,215,194 | A | 11/1965 | Sununu et al. | 165/80.3 |
| 3,223,969 | A | 12/1965 | Alexander | 340/447 |
| 3,267,452 | A | 8/1966 | Wolf | 340/249 |
| 3,356,936 | A | 12/1967 | Smith | 324/429 |
| 3,562,634 | A | 2/1971 | Latner | 324/427 |

(Continued)

FOREIGN PATENT DOCUMENTS

| CN | 2470964 Y | 1/2002 |
|---|---|---|
| CN | 201063352 Y | 5/2008 |

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — Aditya Bhat
(74) *Attorney, Agent, or Firm* — Westman, Champlin & Koehler, P.A.

(57) ABSTRACT

A battery monitoring device configured to monitor a storage battery. The battery monitoring device includes Kelvin connectors configured to couple to the terminals of the storage battery. The battery monitoring device is configured to receive data from a second battery monitoring device. Further, the battery monitoring device is configured to measure a parameter of the storage battery. The measured parameter and the data received from the second battery monitoring device are communicated to a receiving station.

23 Claims, 6 Drawing Sheets

(56) References Cited

U.S. PATENT DOCUMENTS

| | | | |
|---|---|---|---|
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 324/427 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A * | 6/1992 | Yang | G01R 31/3662 324/427 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |

(56) References Cited

U.S. PATENT DOCUMENTS

| | | | |
|---|---|---|---|
| 5,160,881 A | 11/1992 | Schramm et al. ............... 322/7 |
| 5,164,653 A | 11/1992 | Reem |
| 5,168,208 A | 12/1992 | Schultz et al. ................. 322/25 |
| 5,170,124 A | 12/1992 | Blair et al. ................... 324/434 |
| 5,179,335 A | 1/1993 | Nor ............................... 320/159 |
| 5,187,381 A | 2/1993 | Iwasa et al. ................. 307/10.1 |
| 5,187,382 A | 2/1993 | Kondo |
| 5,194,799 A | 3/1993 | Tomantschger ............. 320/103 |
| 5,204,611 A | 4/1993 | Nor et al. ....................... 320/145 |
| 5,214,370 A | 5/1993 | Harm et al. ................... 320/152 |
| 5,214,385 A | 5/1993 | Gabriel et al. ................ 324/434 |
| 5,223,747 A | 6/1993 | Tschulena ..................... 257/713 |
| 5,241,275 A | 8/1993 | Fang ............................. 324/430 |
| 5,254,952 A | 10/1993 | Salley et al. ................. 324/429 |
| 5,266,880 A | 11/1993 | Newland ....................... 320/125 |
| 5,278,759 A | 1/1994 | Berra et al. ..................... 701/1 |
| 5,281,919 A | 1/1994 | Palanisamy ................. 324/427 |
| 5,281,920 A | 1/1994 | Wurst .......................... 324/430 |
| 5,295,078 A | 3/1994 | Stich et al. ................... 700/297 |
| 5,298,797 A | 3/1994 | Redl ............................. 327/387 |
| 5,300,874 A | 4/1994 | Shimamoto et al. ......... 320/106 |
| 5,302,902 A | 4/1994 | Groehl ......................... 324/434 |
| 5,309,052 A | 5/1994 | Kim ............................... 74/350 |
| 5,313,152 A | 5/1994 | Wozniak et al. ............. 320/118 |
| 5,315,287 A | 5/1994 | Sol ................................ 340/455 |
| 5,321,626 A | 6/1994 | Palladino ....................... 702/63 |
| 5,321,627 A | 6/1994 | Reher ............................ 702/63 |
| 5,323,337 A | 6/1994 | Wilson et al. .................. 702/73 |
| 5,325,041 A | 6/1994 | Briggs .......................... 320/149 |
| 5,331,268 A | 7/1994 | Patino et al. ................. 320/158 |
| 5,332,927 A | 7/1994 | Paul et al. ..................... 307/66 |
| 5,336,993 A | 8/1994 | Thomas et al. ............ 324/158.1 |
| 5,338,515 A | 8/1994 | Dalla Betta et al. ........... 422/95 |
| 5,339,018 A | 8/1994 | Brokaw ........................ 320/147 |
| 5,343,380 A | 8/1994 | Champlin ....................... 363/46 |
| 5,345,384 A | 9/1994 | Przybyla et al. ............ 701/29.1 |
| 5,347,163 A | 9/1994 | Yoshimura ..................... 307/66 |
| 5,352,968 A | 10/1994 | Reni et al. .................... 320/136 |
| 5,357,519 A | 10/1994 | Martin et al. ................ 371/15.1 |
| 5,365,160 A | 11/1994 | Leppo et al. ................. 320/116 |
| 5,365,453 A | 11/1994 | Startup et al. ................ 702/36 |
| 5,369,364 A | 11/1994 | Renirie et al. ............... 324/430 |
| 5,381,096 A | 1/1995 | Hirzel ........................... 324/427 |
| 5,384,540 A | 1/1995 | Dessel .......................... 324/539 |
| 5,387,871 A | 2/1995 | Tsai .............................. 324/429 |
| 5,394,093 A | 2/1995 | Cervas .......................... 324/556 |
| 5,402,007 A | 3/1995 | Center et al. ................ 290/40 B |
| 5,410,754 A | 4/1995 | Klotzbach et al. ............ 370/466 |
| 5,412,308 A | 5/1995 | Brown .......................... 323/267 |
| 5,412,323 A | 5/1995 | Kato et al. .................... 324/429 |
| 5,425,041 A | 6/1995 | Seko et al. ................. 372/45.01 |
| 5,426,371 A | 6/1995 | Salley et al. ................. 324/429 |
| 5,426,416 A | 6/1995 | Jefferies et al. ............... 340/664 |
| 5,430,645 A | 7/1995 | Keller ........................ 364/424.01 |
| 5,432,025 A | 7/1995 | Cox ................................ 429/65 |
| 5,432,426 A | 7/1995 | Yoshida ....................... 320/160 |
| 5,434,495 A | 7/1995 | Toko ............................ 320/135 |
| 5,435,185 A | 7/1995 | Eagan ............................ 73/587 |
| 5,442,274 A | 8/1995 | Tamai .......................... 320/160 |
| 5,445,026 A | 8/1995 | Eagan ............................ 73/591 |
| 5,449,996 A | 9/1995 | Matsumoto et al. .......... 320/148 |
| 5,449,997 A | 9/1995 | Gilmore et al. .............. 320/148 |
| 5,451,881 A | 9/1995 | Finger .......................... 324/433 |
| 5,453,027 A | 9/1995 | Buell et al. ................... 439/433 |
| 5,457,377 A | 10/1995 | Jonsson ....................... 324/430 |
| 5,459,660 A | 10/1995 | Berra ............................. 701/33 |
| 5,469,043 A | 11/1995 | Cherng et al. ............... 320/161 |
| 5,485,090 A | 1/1996 | Stephens ...................... 324/433 |
| 5,488,300 A | 1/1996 | Jamieson ...................... 324/432 |
| 5,504,674 A | 4/1996 | Chen et al. ..................... 705/4 |
| 5,508,599 A | 4/1996 | Koenck ........................ 320/138 |
| 5,519,383 A | 5/1996 | De La Rosa ............ 340/636.15 |
| 5,528,148 A | 6/1996 | Rogers ......................... 320/137 |
| 5,537,967 A | 7/1996 | Tashiro et al. ............. 123/192.1 |
| 5,541,489 A | 7/1996 | Dunstan ....................... 320/134 |
| 5,546,317 A | 8/1996 | Andrieu ......................... 702/63 |
| 5,548,273 A | 8/1996 | Nicol et al. .................... 340/439 |
| 5,550,485 A | 8/1996 | Falk .............................. 324/772 |
| 5,561,380 A | 10/1996 | Sway-Tin et al. ............ 324/509 |
| 5,562,501 A | 10/1996 | Kinoshita et al. ............ 439/852 |
| 5,563,496 A | 10/1996 | McClure ..................... 320/128 |
| 5,572,136 A | 11/1996 | Champlin .................... 324/426 |
| 5,573,611 A | 11/1996 | Koch et al. ................ 152/152.1 |
| 5,574,355 A | 11/1996 | McShane et al. ............ 320/161 |
| 5,578,915 A | 11/1996 | Crouch, Jr. et al. ........... 324/428 |
| 5,583,416 A | 12/1996 | Klang .......................... 320/160 |
| 5,585,416 A | 12/1996 | Audett et al. .................. 522/35 |
| 5,585,728 A | 12/1996 | Champlin .................... 324/427 |
| 5,589,757 A | 12/1996 | Klang .......................... 320/160 |
| 5,592,093 A | 1/1997 | Klingbiel ..................... 324/426 |
| 5,592,094 A | 1/1997 | Ichikawa ..................... 324/427 |
| 5,596,260 A | 1/1997 | Moravec et al. ............. 320/135 |
| 5,596,261 A | 1/1997 | Suyama ....................... 320/152 |
| 5,598,098 A | 1/1997 | Champlin .................... 324/430 |
| 5,602,462 A | 2/1997 | Stich et al. ................... 323/258 |
| 5,606,242 A | 2/1997 | Hull et al. .................... 320/106 |
| 5,614,788 A | 3/1997 | Mullins et al. ................. 315/82 |
| 5,621,298 A | 4/1997 | Harvey ........................ 320/134 |
| 5,631,536 A | 5/1997 | Tseng ............................ 320/15 |
| 5,631,831 A | 5/1997 | Bird et al. .................... 701/34.4 |
| 5,633,985 A | 5/1997 | Severson et al. ............. 704/267 |
| 5,637,978 A | 6/1997 | Kellett et al. ................ 320/104 |
| 5,642,031 A | 6/1997 | Brotto ......................... 320/156 |
| 5,644,212 A | 7/1997 | Takahashi |
| 5,650,937 A | 7/1997 | Bounaga ....................... 702/65 |
| 5,652,501 A | 7/1997 | McClure et al. .......... 340/636.15 |
| 5,653,659 A | 8/1997 | Kunibe et al. ................ 477/111 |
| 5,654,623 A | 8/1997 | Shiga et al. .................. 320/106 |
| 5,656,920 A | 8/1997 | Cherng et al. ............... 324/431 |
| 5,661,368 A | 8/1997 | Deol et al. ..................... 315/82 |
| 5,666,040 A | 9/1997 | Bourbeau |
| 5,675,234 A | 10/1997 | Greene ..................... 340/636.11 |
| 5,677,077 A | 10/1997 | Faulk ............................ 429/90 |
| 5,684,678 A | 11/1997 | Barrett .......................... 363/17 |
| 5,685,734 A * | 11/1997 | Kutz ....................... H01M 2/20 439/371 |
| 5,691,621 A | 11/1997 | Phuoc et al. ................. 320/134 |
| 5,699,050 A | 12/1997 | Kanazawa ............... 340/636.13 |
| 5,701,089 A | 12/1997 | Perkins ........................ 324/772 |
| 5,705,929 A | 1/1998 | Caravello et al. ............ 324/430 |
| 5,707,015 A | 1/1998 | Guthrie ........................ 241/120 |
| 5,710,503 A | 1/1998 | Sideris et al. ................ 320/116 |
| 5,711,648 A | 1/1998 | Hammerslag ................ 414/800 |
| 5,712,795 A | 1/1998 | Layman et al. .............. 700/297 |
| 5,717,336 A | 2/1998 | Basell et al. ................. 324/430 |
| 5,717,937 A | 2/1998 | Fritz ............................. 713/300 |
| 5,721,688 A | 2/1998 | Bramwell ..................... 324/426 |
| 5,732,074 A | 3/1998 | Spaur et al. .................. 370/313 |
| 5,739,667 A | 4/1998 | Matsuda et al. .............. 320/128 |
| 5,744,962 A | 4/1998 | Alber et al. ................... 324/426 |
| 5,745,044 A | 4/1998 | Hyatt, Jr. et al. ............. 340/5.23 |
| 5,747,189 A | 5/1998 | Perkins .......................... 429/91 |
| 5,747,909 A | 5/1998 | Syverson et al. ......... 310/156.56 |
| 5,747,967 A | 5/1998 | Muljadi et al. ............... 320/148 |
| 5,754,417 A | 5/1998 | Nicollini ........................ 363/60 |
| 5,757,192 A | 5/1998 | McShane et al. ............. 324/427 |
| 5,760,587 A | 6/1998 | Harvey ........................ 324/434 |
| 5,772,468 A | 6/1998 | Kowalski et al. ............. 439/506 |
| 5,773,962 A | 6/1998 | Nor |
| 5,773,978 A | 6/1998 | Becker ......................... 324/430 |
| 5,778,326 A | 7/1998 | Moroto et al. ................. 701/22 |
| 5,780,974 A | 7/1998 | Pabla et al. .................... 315/82 |
| 5,780,980 A | 7/1998 | Naito ............................ 318/139 |
| 5,789,899 A | 8/1998 | van Phuoc et al. ........... 320/112 |
| 5,793,359 A | 8/1998 | Ushikubo ..................... 345/169 |
| 5,796,239 A | 8/1998 | van Phuoc et al. ........... 320/107 |
| 5,808,469 A | 9/1998 | Kopera ........................ 324/434 |
| 5,811,979 A | 9/1998 | Rhein ........................... 324/718 |
| 5,818,201 A | 10/1998 | Stockstad et al. ............ 320/119 |
| 5,818,234 A | 10/1998 | McKinnon .................. 324/433 |
| 5,820,407 A | 10/1998 | Morse et al. ................. 439/504 |
| 5,821,756 A | 10/1998 | McShane et al. ............. 324/430 |
| 5,821,757 A | 10/1998 | Alvarez et al. ............... 324/434 |
| 5,825,174 A | 10/1998 | Parker .......................... 324/106 |

(56) References Cited

U.S. PATENT DOCUMENTS

| | | | | |
|---|---|---|---|---|
| 5,831,435 | A | 11/1998 | Troy | 324/426 |
| 5,832,396 | A | 11/1998 | Moroto et al. | 701/22 |
| 5,850,113 | A | 12/1998 | Weimer et al. | 307/125 |
| 5,862,515 | A | 1/1999 | Kobayashi et al. | 702/63 |
| 5,865,638 | A | 2/1999 | Trafton | 439/288 |
| 5,869,951 | A | 2/1999 | Takahashi | 320/104 |
| 5,870,018 | A | 2/1999 | Person | 307/10.2 |
| 5,871,858 | A | 2/1999 | Thomsen et al. | 429/7 |
| 5,872,443 | A | 2/1999 | Williamson | 320/160 |
| 5,872,453 | A | 2/1999 | Shimoyama et al. | 324/431 |
| 5,883,306 | A | 3/1999 | Hwang | 73/146.8 |
| 5,884,202 | A | 3/1999 | Arjomand | 701/31.4 |
| 5,895,440 | A | 4/1999 | Proctor et al. | 702/63 |
| 5,903,154 | A | 5/1999 | Zhang et al. | 324/437 |
| 5,903,716 | A | 5/1999 | Kimber et al. | 395/114 |
| 5,912,534 | A | 6/1999 | Benedict | 315/82 |
| 5,914,605 | A | 6/1999 | Bertness | 324/426 |
| 5,916,287 | A | 6/1999 | Arjomand et al. | 701/33.2 |
| 5,927,938 | A | 7/1999 | Hammerslag | 414/809 |
| 5,929,609 | A | 7/1999 | Joy et al. | 322/25 |
| 5,935,180 | A | 8/1999 | Fieramosca et al. | 701/29.6 |
| 5,939,855 | A | 8/1999 | Proctor et al. | 320/104 |
| 5,939,861 | A | 8/1999 | Joko et al. | 320/122 |
| 5,945,829 | A | 8/1999 | Bertness | 324/430 |
| 5,946,605 | A | 8/1999 | Takahisa et al. | 455/68 |
| 5,950,144 | A | 9/1999 | Hall et al. | 702/108 |
| 5,951,229 | A | 9/1999 | Hammerslag | 414/398 |
| 5,953,322 | A | 9/1999 | Kimball | 370/328 |
| 5,955,951 | A | 9/1999 | Wischerop et al. | 340/572.8 |
| 5,961,561 | A | 10/1999 | Wakefield, II | 701/29 |
| 5,961,604 | A | 10/1999 | Anderson et al. | 709/229 |
| 5,963,012 | A | 10/1999 | Garcia et al. | 320/106 |
| 5,969,625 | A | 10/1999 | Russo | 340/636.19 |
| 5,973,598 | A | 10/1999 | Beigel | 340/572.1 |
| 5,978,805 | A | 11/1999 | Carson | 707/10 |
| 5,982,138 | A | 11/1999 | Krieger | 320/105 |
| 5,990,664 | A | 11/1999 | Rahman | 320/136 |
| 6,002,238 | A | 12/1999 | Champlin | 320/134 |
| 6,005,489 | A | 12/1999 | Siegle et al. | 340/825.69 |
| 6,005,759 | A | 12/1999 | Hart et al. | 361/66 |
| 6,008,652 | A | 12/1999 | Theofanopoulos et al. | 324/434 |
| 6,009,369 | A | 12/1999 | Boisvert et al. | 701/99 |
| 6,016,047 | A | 1/2000 | Notten et al. | 320/137 |
| 6,031,354 | A | 2/2000 | Wiley et al. | 320/116 |
| 6,031,368 | A | 2/2000 | Klippel et al. | 324/133 |
| 6,037,745 | A | 3/2000 | Koike et al. | 320/104 |
| 6,037,749 | A | 3/2000 | Parsonage | 320/132 |
| 6,037,751 | A | 3/2000 | Klang | 320/160 |
| 6,037,777 | A | 3/2000 | Champlin | 324/430 |
| 6,037,778 | A | 3/2000 | Makhija | 324/433 |
| 6,046,514 | A | 4/2000 | Rouillard et al. | 307/77 |
| 6,051,976 | A | 4/2000 | Bertness | 324/426 |
| 6,055,468 | A | 4/2000 | Kaman et al. | 701/29 |
| 6,061,638 | A | 5/2000 | Joyce | 702/63 |
| 6,064,372 | A | 5/2000 | Kahkoska | 345/173 |
| 6,072,299 | A | 6/2000 | Kurle et al. | 320/112 |
| 6,072,300 | A | 6/2000 | Tsuji | 320/116 |
| 6,075,339 | A | 6/2000 | Reipur et al. | 320/110 |
| 6,081,098 | A | 6/2000 | Bertness et al. | 320/134 |
| 6,081,109 | A | 6/2000 | Seymour et al. | 324/127 |
| 6,081,154 | A | 6/2000 | Ezell et al. | 327/540 |
| 6,087,815 | A | 7/2000 | Pfeifer et al. | 323/282 |
| 6,088,652 | A | 7/2000 | Abe | 324/434 |
| 6,091,238 | A | 7/2000 | McDermott | 324/207.2 |
| 6,091,245 | A | 7/2000 | Bertness | 324/426 |
| 6,094,033 | A | 7/2000 | Ding et al. | 320/132 |
| 6,097,193 | A | 8/2000 | Bramwell | 324/429 |
| 6,100,670 | A | 8/2000 | Levesque | 320/150 |
| 6,100,815 | A | 8/2000 | Pailthorp | 324/754.07 |
| 6,104,167 | A | 8/2000 | Bertness et al. | 320/132 |
| 6,113,262 | A | 9/2000 | Purola et al. | 374/45 |
| 6,114,834 | A | 9/2000 | Parise | 320/109 |
| 6,121,880 | A | 9/2000 | Scott et al. | 340/572.5 |
| 6,136,914 | A | 10/2000 | Hergenrother et al. | 524/495 |
| 6,137,269 | A | 10/2000 | Champlin | 320/150 |
| 6,140,797 | A | 10/2000 | Dunn | 320/105 |
| 6,141,608 | A | 10/2000 | Rother | 701/29.6 |
| 6,144,185 | A | 11/2000 | Dougherty et al. | 320/132 |
| 6,147,598 | A | 11/2000 | Murphy et al. | 340/426.19 |
| 6,150,793 | A | 11/2000 | Lesesky et al. | 320/104 |
| 6,158,000 | A | 12/2000 | Collins | 713/1 |
| 6,161,640 | A | 12/2000 | Yamaguchi | 180/65.8 |
| 6,163,156 | A | 12/2000 | Bertness | 324/426 |
| 6,164,063 | A | 12/2000 | Mendler | 60/274 |
| 6,167,349 | A | 12/2000 | Alvarez | 702/63 |
| 6,172,483 | B1 | 1/2001 | Champlin | 320/134 |
| 6,172,505 | B1 | 1/2001 | Bertness | 324/430 |
| 6,177,737 | B1 | 1/2001 | Palfey et al. | 307/64 |
| 6,181,545 | B1 | 1/2001 | Amatucci et al. | 361/502 |
| 6,184,656 | B1 | 2/2001 | Karunasiri et al. | |
| 6,191,557 | B1 | 2/2001 | Gray et al. | 320/132 |
| 6,202,739 | B1 * | 3/2001 | Pal et al. | 165/104.33 |
| 6,211,651 | B1 | 4/2001 | Nemoto | 320/133 |
| 6,211,653 | B1 | 4/2001 | Stasko | 320/132 |
| 6,215,275 | B1 | 4/2001 | Bean | 320/106 |
| 6,218,805 | B1 | 4/2001 | Melcher | 320/105 |
| 6,218,936 | B1 | 4/2001 | Imao | 340/447 |
| 6,222,342 | B1 | 4/2001 | Eggert et al. | 320/105 |
| 6,222,369 | B1 | 4/2001 | Champlin | 324/430 |
| D442,503 | S | 5/2001 | Lundbeck et al. | D10/77 |
| 6,225,808 | B1 | 5/2001 | Varghese et al. | 324/426 |
| 6,225,898 | B1 | 5/2001 | Kamiya et al. | 340/505 |
| 6,236,186 | B1 | 5/2001 | Helton et al. | |
| 6,236,332 | B1 | 5/2001 | Conkright et al. | 340/3.1 |
| 6,236,949 | B1 | 5/2001 | Hart | |
| 6,238,253 | B1 | 5/2001 | Qualls | 439/759 |
| 6,242,887 | B1 | 6/2001 | Burke | 320/104 |
| 6,249,124 | B1 | 6/2001 | Bertness | 324/426 |
| 6,250,973 | B1 | 6/2001 | Lowery et al. | 439/763 |
| 6,254,438 | B1 | 7/2001 | Gaunt | 439/755 |
| 6,255,826 | B1 | 7/2001 | Ohsawa | 320/116 |
| 6,259,170 | B1 | 7/2001 | Limoge et al. | 307/10.8 |
| 6,259,254 | B1 | 7/2001 | Klang | 324/427 |
| 6,262,563 | B1 | 7/2001 | Champlin | 320/134 |
| 6,262,692 | B1 | 7/2001 | Babb | 343/895 |
| 6,263,268 | B1 | 7/2001 | Nathanson | 701/29 |
| 6,263,322 | B1 | 7/2001 | Kirkevold et al. | 705/400 |
| 6,271,643 | B1 | 8/2001 | Becker et al. | 320/112 |
| 6,271,748 | B1 | 8/2001 | Derbyshire et al. | 340/442 |
| 6,272,387 | B1 | 8/2001 | Yoon | 700/83 |
| 6,275,008 | B1 | 8/2001 | Arai et al. | 320/132 |
| 6,285,191 | B1 | 9/2001 | Gollomp et al. | 324/427 |
| 6,294,896 | B1 | 9/2001 | Champlin | 320/134 |
| 6,294,897 | B1 | 9/2001 | Champlin | 320/153 |
| 6,304,087 | B1 | 10/2001 | Bertness | 324/426 |
| 6,307,349 | B1 | 10/2001 | Koenck et al. | 320/112 |
| 6,310,481 | B2 | 10/2001 | Bertness | 324/430 |
| 6,313,607 | B1 | 11/2001 | Champlin | 320/132 |
| 6,313,608 | B1 | 11/2001 | Varghese et al. | 320/132 |
| 6,316,914 | B1 | 11/2001 | Bertness | 320/134 |
| 6,320,351 | B1 | 11/2001 | Ng et al. | 320/104 |
| 6,323,650 | B1 | 11/2001 | Bertness et al. | 324/426 |
| 6,324,042 | B1 | 11/2001 | Andrews | 361/93.2 |
| 6,329,793 | B1 | 12/2001 | Bertness et al. | 320/132 |
| 6,331,762 | B1 | 12/2001 | Bertness | 320/134 |
| 6,332,113 | B1 | 12/2001 | Bertness | 702/63 |
| 6,346,795 | B2 | 2/2002 | Haraguchi et al. | 320/136 |
| 6,347,958 | B1 | 2/2002 | Tsai | 439/488 |
| 6,351,102 | B1 | 2/2002 | Troy | 320/139 |
| 6,356,042 | B1 | 3/2002 | Kahlon et al. | 318/138 |
| 6,356,083 | B1 | 3/2002 | Ying | |
| 6,359,441 | B1 | 3/2002 | Bertness | 324/426 |
| 6,359,442 | B1 | 3/2002 | Henningson et al. | 324/426 |
| 6,363,303 | B1 | 3/2002 | Bertness | 701/29 |
| RE37,677 | E | 4/2002 | Irie | 315/83 |
| 6,377,031 | B1 | 4/2002 | Karuppana et al. | 323/220 |
| 6,384,608 | B1 | 5/2002 | Namaky | 324/430 |
| 6,388,448 | B1 | 5/2002 | Cervas | 324/426 |
| 6,389,337 | B1 | 5/2002 | Kolls | 701/31.6 |
| 6,392,414 | B2 | 5/2002 | Bertness | 324/429 |
| 6,396,278 | B1 | 5/2002 | Makhija | 324/402 |
| 6,407,554 | B1 | 6/2002 | Godau et al. | 324/503 |
| 6,411,098 | B1 | 6/2002 | Laletin | 324/436 |
| 6,417,669 | B1 | 7/2002 | Champlin | 324/426 |

(56) References Cited

U.S. PATENT DOCUMENTS

| | | | |
|---|---|---|---|
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,433,512 B1 | 8/2002 | Birkler et al. | 320/132 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 24/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/31 |
| 6,636,790 B1 | 10/2003 | Lightner et al. | 701/31.5 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,832,141 B2 | 12/2004 | Skeen et al. | 701/31.4 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,911,825 B2 | 6/2005 | Namaky | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,957,133 B1 | 10/2005 | Hunt et al. | 701/32.4 |
| 6,967,484 B2 | 11/2005 | Bertness | 324/426 |
| 6,972,662 B1 | 12/2005 | Ohkawa et al. | 340/10.1 |
| 6,983,212 B2 | 1/2006 | Burns | 702/63 |
| 6,988,053 B2 | 1/2006 | Namaky | 320/104 |
| 6,993,421 B2 | 1/2006 | Pillar et al. | 701/29.4 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2 | 5/2006 | Paulsen | 340/438 |
| 7,049,822 B2 | 5/2006 | Kung | 324/426 |
| 7,058,525 B2 | 6/2006 | Bertness et al. | 702/63 |
| 7,069,979 B2 | 7/2006 | Tobias | 165/104.33 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,173,182 B2 | 2/2007 | Katsuyama | 174/36 |
| 7,177,925 B2 | 2/2007 | Carcido et al. | |
| 7,182,147 B2 | 2/2007 | Cutler et al. | 173/1 |
| 7,184,866 B2 | 2/2007 | Squires | 340/426.15 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al | 700/276 |
| 7,219,023 B2 | 5/2007 | Banke et al. | |
| 7,233,128 B2 | 6/2007 | Brost et al. | |
| 7,235,977 B2 | 6/2007 | Koran et al. | 324/426 |
| 7,246,015 B2 | 7/2007 | Bertness et al. | 702/63 |
| 7,272,519 B2 | 9/2007 | Lesesky et al. | 702/63 |
| 7,287,001 B1 | 10/2007 | Falls et al. | |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,376,497 B2 | 5/2008 | Chen | 701/31.6 |
| 7,398,176 B2 | 7/2008 | Bertness | 702/140 |
| 7,408,358 B2 | 8/2008 | Knopf | 324/426 |

(56) References Cited

U.S. PATENT DOCUMENTS

| | | | |
|---|---|---|---|
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | |
| 7,684,908 B1 | 3/2010 | Ogilvie et al. | 701/29.6 |
| 7,688,074 B2 | 3/2010 | Cox et al. | 324/426 |
| 7,698,179 B2 | 4/2010 | Leung et al. | |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,743,788 B2 | 6/2010 | Schmitt | 137/554 |
| 7,744,149 B2 | 6/2010 | Murray et al. | 307/31 |
| 7,751,953 B2 | 7/2010 | Namaky | 701/33.2 |
| 7,772,850 B2 | 8/2010 | Bertness | 324/426 |
| 7,774,130 B2 | 8/2010 | Pepper | 340/439 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | |
| 7,902,990 B2 | 3/2011 | Delmonico et al. | 340/636.1 |
| 7,924,015 B2 | 4/2011 | Bertness | 324/427 |
| 7,940,053 B2 | 5/2011 | Brown et al. | 324/426 |
| 7,990,155 B2 | 8/2011 | Henningson | 324/429 |
| 8,024,083 B2 | 9/2011 | Chenn | 701/2 |
| 8,164,343 B2 | 4/2012 | Bertness | 324/503 |
| 8,222,868 B2 | 7/2012 | Buckner | 320/136 |
| 8,306,690 B2 | 11/2012 | Bertness | 701/34.4 |
| 8,449,560 B2 | 5/2013 | Roth | 227/175.1 |
| 8,594,957 B2 | 11/2013 | Gauthier | 324/548 |
| 8,827,729 B2 | 9/2014 | Gunreben | 439/188 |
| 9,037,394 B2 | 5/2015 | Fernandes | 701/400 |
| 2001/0012738 A1 | 8/2001 | Duperret | 439/835 |
| 2001/0035737 A1 | 11/2001 | Nakanishi et al. | |
| 2001/0048215 A1 | 12/2001 | Breed et al. | 280/728.1 |
| 2002/0003423 A1 | 1/2002 | Bertness et al. | 324/426 |
| 2002/0004694 A1 | 1/2002 | McLeod et al. | 701/29 |
| 2002/0007237 A1 | 1/2002 | Phung et al. | 701/33 |
| 2002/0010558 A1 | 1/2002 | Bertness et al. | 702/63 |
| 2002/0021135 A1 | 2/2002 | Li et al. | |
| 2002/0027346 A1 | 3/2002 | Breed et al. | 280/735 |
| 2002/0030495 A1 | 3/2002 | Kechmire | 324/427 |
| 2002/0036504 A1 | 3/2002 | Troy et al. | 324/430 |
| 2002/0041175 A1 | 4/2002 | Lauper et al. | 320/106 |
| 2002/0044050 A1 | 4/2002 | Derbyshire et al. | 340/442 |
| 2002/0047711 A1 | 4/2002 | Bertness et al. | 324/426 |
| 2002/0050163 A1 | 5/2002 | Makhija et al. | 73/116 |
| 2002/0074398 A1 | 6/2002 | Lancos et al. | |
| 2002/0116140 A1 | 8/2002 | Rider | 702/63 |
| 2002/0118111 A1 | 8/2002 | Brown et al. | 340/573.1 |
| 2002/0121901 A1 | 9/2002 | Hoffman | 324/426 |
| 2002/0128985 A1 | 9/2002 | Greenwald | 705/400 |
| 2002/0130665 A1 | 9/2002 | Bertness et al. | 324/426 |
| 2002/0171428 A1 | 11/2002 | Bertness | 702/63 |
| 2002/0176010 A1 | 11/2002 | Wallach et al. | 348/362 |
| 2003/0006779 A1 | 1/2003 | Youval | 324/503 |
| 2003/0009270 A1 | 1/2003 | Breed | 701/29 |
| 2003/0017753 A1 | 1/2003 | Palmisano et al. | 439/762 |
| 2003/0025481 A1 | 2/2003 | Bertness | 324/427 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | 702/63 |
| 2003/0124417 A1* | 7/2003 | Bertness et al. | 429/90 |
| 2003/0128011 A1 | 7/2003 | Bertness | |
| 2003/0128036 A1 | 7/2003 | Henningson et al. | 324/426 |
| 2003/0137277 A1 | 7/2003 | Mori et al. | 320/132 |
| 2003/0169018 A1 | 9/2003 | Berels et al. | 320/132 |
| 2003/0169019 A1 | 9/2003 | Oosaki | |
| 2003/0171111 A1 | 9/2003 | Clark | 455/414.1 |
| 2003/0177417 A1 | 9/2003 | Malhotra et al. | 714/42 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2003/0236656 A1 | 12/2003 | Dougherty | 703/14 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0036443 A1 | 2/2004 | Bertness | 320/109 |
| 2004/0044452 A1 | 3/2004 | Bauer et al. | 703/33 |
| 2004/0044454 A1 | 3/2004 | Ross et al. | 701/33 |
| 2004/0049361 A1 | 3/2004 | Hamdan et al. | 702/115 |
| 2004/0051532 A1 | 3/2004 | Smith et al. | 324/426 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/182 |
| 2004/0064225 A1 | 4/2004 | Jammu et al. | 701/29 |
| 2004/0065489 A1 | 4/2004 | Aberle | 180/65.1 |
| 2004/0088087 A1 | 5/2004 | Fukushima et al. | 701/32 |
| 2004/0113588 A1 | 6/2004 | Mikuriya et al. | 320/128 |
| 2004/0145342 A1 | 7/2004 | Lyon | 320/108 |
| 2004/0164706 A1 | 8/2004 | Osborne | |
| 2004/0172177 A1 | 9/2004 | Nagai et al. | 701/29 |
| 2004/0178185 A1 | 9/2004 | Yoshikawa et al. | 219/270 |
| 2004/0189309 A1 | 9/2004 | Bertness et al. | 324/426 |
| 2004/0199343 A1 | 10/2004 | Cardinal et al. | 702/63 |
| 2004/0207367 A1 | 10/2004 | Taniguchi et al. | 320/149 |
| 2004/0221641 A1 | 11/2004 | Moritsugu | 73/23.31 |
| 2004/0227523 A1 | 11/2004 | Namaky | 324/537 |
| 2004/0239332 A1 | 12/2004 | Mackel et al. | 324/426 |
| 2004/0251876 A1 | 12/2004 | Bertness et al. | 320/136 |
| 2004/0257084 A1 | 12/2004 | Restaino | 324/400 |
| 2005/0007068 A1 | 1/2005 | Johnson et al. | 320/110 |
| 2005/0009122 A1 | 1/2005 | Whelan et al. | 435/7.32 |
| 2005/0017726 A1 | 1/2005 | Koran et al. | 324/433 |
| 2005/0017952 A1 | 1/2005 | Hsi | 345/169 |
| 2005/0021197 A1 | 1/2005 | Zimmerman | 701/31.4 |
| 2005/0021294 A1 | 1/2005 | Trsar et al. | 702/183 |
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0060070 A1 | 3/2005 | Kapolka et al. | 701/29 |
| 2005/0073314 A1 | 4/2005 | Bertness et al. | |
| 2005/0076381 A1 | 4/2005 | Gross | 725/107 |
| 2005/0096809 A1 | 5/2005 | Skeen et al. | 701/29 |
| 2005/0102073 A1 | 5/2005 | Ingram | 701/29 |
| 2005/0119809 A1 | 6/2005 | Chen | 701/33.5 |
| 2005/0128083 A1 | 6/2005 | Puzio et al. | 340/572.1 |
| 2005/0128902 A1 | 6/2005 | Tsai | 369/44.32 |
| 2005/0133245 A1 | 6/2005 | Katsuyama | 174/74 R |
| 2005/0134282 A1 | 6/2005 | Averbuch | 324/426 |

(56) References Cited

U.S. PATENT DOCUMENTS

| | | | |
|---|---|---|---|
| 2005/0143882 A1 | 6/2005 | Umezawa | 701/29 |
| 2005/0159847 A1 | 7/2005 | Shah et al. | 700/276 |
| 2005/0162172 A1* | 7/2005 | Bertness | 324/426 |
| 2005/0168226 A1 | 8/2005 | Quint et al. | |
| 2005/0173142 A1 | 8/2005 | Cutler et al. | 173/181 |
| 2005/0182536 A1 | 8/2005 | Doyle et al. | 701/29 |
| 2005/0212521 A1 | 9/2005 | Bertness et al. | 324/426 |
| 2005/0213874 A1 | 9/2005 | Kline | 385/15 |
| 2005/0218902 A1 | 10/2005 | Restaino et al. | 324/433 |
| 2005/0231205 A1 | 10/2005 | Bertness et al. | 324/426 |
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | |
| 2005/0269880 A1 | 12/2005 | Konishi | 307/10.7 |
| 2006/0012330 A1 | 1/2006 | Okumura et al. | |
| 2006/0017447 A1 | 1/2006 | Bertness | 324/538 |
| 2006/0026017 A1 | 2/2006 | Walkder | 701/31.4 |
| 2006/0030980 A1 | 2/2006 | St. Denis | 701/29 |
| 2006/0043976 A1 | 3/2006 | Gervais | 324/508 |
| 2006/0079203 A1 | 4/2006 | Nicolini | 455/411 |
| 2006/0089767 A1 | 4/2006 | Sowa | 701/29 |
| 2006/0095230 A1 | 5/2006 | Grier et al. | 702/183 |
| 2006/0102397 A1 | 5/2006 | Buck | 429/432 |
| 2006/0152224 A1 | 7/2006 | Kim et al. | 324/430 |
| 2006/0155439 A1 | 7/2006 | Slawinski | 701/33.4 |
| 2006/0161313 A1 | 7/2006 | Rogers et al. | 701/1 |
| 2006/0161390 A1 | 7/2006 | Namaky et al. | 702/183 |
| 2006/0217914 A1 | 9/2006 | Bertness | 702/113 |
| 2006/0244457 A1 | 11/2006 | Henningson et al. | 324/426 |
| 2006/0282323 A1 | 12/2006 | Walker et al. | 705/14 |
| 2007/0005201 A1 | 1/2007 | Chenn | 701/31.5 |
| 2007/0024460 A1 | 2/2007 | Clark | 340/663 |
| 2007/0026916 A1 | 2/2007 | Juds et al. | 463/1 |
| 2007/0046261 A1* | 3/2007 | Porebski | 320/132 |
| 2007/0088472 A1 | 4/2007 | Ganzhorn et al. | 701/33 |
| 2007/0108942 A1 | 5/2007 | Johnson et al. | 320/132 |
| 2007/0159177 A1 | 7/2007 | Bertness et al. | 324/426 |
| 2007/0182576 A1 | 8/2007 | Proska et al. | 340/636.1 |
| 2007/0194791 A1 | 8/2007 | Huang | 324/430 |
| 2007/0194793 A1 | 8/2007 | Bertness | 324/503 |
| 2007/0205983 A1 | 9/2007 | Naimo | 345/160 |
| 2007/0259256 A1 | 11/2007 | Le Canut et al. | 429/90 |
| 2008/0036421 A1 | 2/2008 | Seo | 320/132 |
| 2008/0059014 A1 | 3/2008 | Nasr et al. | 701/22 |
| 2008/0064559 A1 | 3/2008 | Cawthorne | 477/5 |
| 2008/0086246 A1 | 4/2008 | Bolt et al. | 701/29 |
| 2008/0094068 A1 | 4/2008 | Scott | 324/426 |
| 2008/0103656 A1 | 5/2008 | Lipscomb | 701/33.4 |
| 2008/0169818 A1 | 7/2008 | Lesesky et al. | 324/426 |
| 2008/0303528 A1 | 12/2008 | Kim | 324/430 |
| 2008/0303529 A1 | 12/2008 | Nakamura et al. | 324/433 |
| 2008/0315830 A1 | 12/2008 | Bertness | 320/104 |
| 2009/0006476 A1 | 1/2009 | Andreasen et al. | 707/104.1 |
| 2009/0024266 A1 | 1/2009 | Bertness | 701/22 |
| 2009/0024419 A1 | 1/2009 | McClellan | 705/4 |
| 2009/0085571 A1 | 4/2009 | Bertness | 324/426 |
| 2009/0146800 A1 | 6/2009 | Grimlund et al. | 340/505 |
| 2009/0198372 A1 | 8/2009 | Hammerslag | 700/226 |
| 2009/0203427 A1 | 8/2009 | Fifelski | 439/345 |
| 2009/0247020 A1 | 10/2009 | Gathman et al. | 439/759 |
| 2009/0265121 A1* | 10/2009 | Rocci | G01R 31/362 702/57 |
| 2009/0276115 A1 | 11/2009 | Chen | 701/32 |
| 2010/0023198 A1 | 1/2010 | Hamilton | 701/29 |
| 2010/0145780 A1 | 6/2010 | Nishikawa et al. | 705/14.11 |
| 2010/0314950 A1 | 12/2010 | Rutkowski et al. | 307/125 |
| 2011/0004427 A1 | 1/2011 | Gorbold et al. | 702/63 |
| 2011/0015815 A1 | 1/2011 | Bertness | 701/22 |
| 2011/0215767 A1 | 9/2011 | Johnson et al. | 320/136 |
| 2011/0273181 A1 | 11/2011 | Park et al. | 324/429 |
| 2012/0046824 A1 | 2/2012 | Ruther et al. | 701/31.5 |
| 2012/0062237 A1 | 3/2012 | Robinson | 324/433 |
| 2012/0074904 A1 | 3/2012 | Rutkowski et al. | 320/112 |
| 2012/0116391 A1 | 5/2012 | Houser | 606/41 |
| 2012/0256494 A1 | 10/2012 | Kesler | 307/104 |
| 2013/0158782 A1 | 6/2013 | Bertness et al. | 701/34.4 |
| 2013/0311124 A1 | 11/2013 | Van Bremen | 702/104 |
| 2014/0002094 A1 | 1/2014 | Champlin | 324/426 |

FOREIGN PATENT DOCUMENTS

| | | |
|---|---|---|
| DE | 29 26 716 B1 | 1/1981 |
| DE | 196 38 324 | 9/1996 |
| DE | 10 2008 036 595 A1 | 2/2010 |
| EP | 0 022 450 A1 | 1/1981 |
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 807 710 B1 * | 7/2007 |
| EP | 1 807 710 | 1/2010 |
| EP | 1807710 B1 | 1/2010 |
| FR | 2 749 397 | 12/1997 |
| GB | 154 016 | 11/1920 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 11-271409 | 10/1999 |
| JP | 2001057711 A | 2/2001 |
| JP | 2003-346909 | 12/2003 |
| JP | 2006331976 A | 12/2006 |
| JP | 2009-244166 | 10/2009 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

(56) References Cited

FOREIGN PATENT DOCUMENTS

| WO | WO 2010/007681 | 1/2010 |
|---|---|---|
| WO | WO 2011/153419 | 12/2011 |

OTHER PUBLICATIONS

"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N. A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard—Lead Acid Batteries for Automobiles", *Japanese Standards Association UDC*, 621.355.2:629.113.006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Willihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design A 60 Hz Notch Filter with the UAF42", Jan. 1994, AB-071, 1994.
National Semiconductor Corporation, "LMF90-4$^{th}$-Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powederdesigners.com/InforWeb.design_center/articles/DC-DC/converter.shtm, prior to Oct. 1, 2002.
"Notification of Transmittal of The International Search Report or the Declaration", PCT/US02/29461, filed Sep. 17, 2002 and mailed Jan. 3, 2003.
"Notification of Transmittal of The International Search Report or the Declaration", PCT/UE03/07546, filed Mar. 13, 2003 and mailed Jul. 4, 2001.
"Notification of Transmittal of the International Search Report or the Declaration", PCT/US03/06577, filed Mar. 5, 2003 and mailed Jul. 24, 2003.
"Notification of Transmittal of The International Search Report or the Declaration", PCT/US03/07837, filed Mar. 14, 2003 and mailed Jul. 4, 2003.
"Improved Impedance Spectroscopy Technique for Status Determination of Production Li/SO$_2$ Batteries" Terrill Atwater et al., pp. 10-113, (1992).
"Notification of Transmittal of The International Search Report or the Declaration", PCT/US03/41561; Search Report completed Apr. 13, 2004, mailed May 6, 2004.
"Notification of Transmittal of The International Search Report or the Declaration", PCT/US03/27696, filed Sep. 4, 2003 and mailed Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois pp. 1-1-14-13, (1991).
Supplementary European Search Report Communication for Appl. No. 99917402.2; Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and mailed Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, date of document Jan. 28, 2005.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*. published Oct. 2001, IEE, pp. 433-440.
"Examination Report" from the UK Patent Office for App. No. 0417678.0; Jan. 24, 2005.
Wikipedia Online Encyclopedia, INDUCTANCE, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by E. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).

(56) References Cited

OTHER PUBLICATIONS

"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et la., Mar. 2000, 6 pgs; (10 total pgs.).
Examination Report under Section 18(3) from Great Britain Application No. GB1000773.0, dated Feb. 6, 2012, 2 pages.
Search Report and Written Opinion from PCT Application No. PCT/US2011/026608, dated Aug. 29, 2011, 9 pgs.
Search Report and Written Opinion from PCT Application No. PCT/US2011/038279, dated Sep. 16, 2011, 12 pgs.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV PLUS Battery Packs", by A. Paryani, *IEEE AES Systems Magazines*, Nov. 2000, pp. 21-24.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in related Korean patent application No. 10-2012-7033020, 2 pgs. including English Translation.
Official Action dated Feb. 20, 2014 in Korean patent application No. 10-2013-7004814, 6 pgs. including English Translation.
Office Action from U.S. Appl. No. 12/818,290, dated Feb. 25, 2014.
Office Action from U.S. Appl. No. 12/818,290, dated Aug. 8, 2013.
Office Action from U.S. Appl. No. 12/818,290, dated Mar. 6, 2013.
Office Action from U.S. Appl. No. 12/818,290, dated Aug. 2, 2012.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111030643 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action from U.S. Appl. No. 12/818,290, dated Jun. 18, 2014.
Office Action from U.S. Appl. No. 12/818,290, dated Dec. 1, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action for Chinese Patent Application No. 201180030045.8, dated Mar. 24, 2015.
Office Action for Japanese Patent Application No. 2013-531839, dated Mar. 31, 2015.
Office Action from U.S. Appl. No. 12/818,290, dated Apr. 3, 2015.
Notification of Transmittal of the International Search Report and Written Opinion from PCT/US2014/069661, dated Mar. 26, 2015.
Office Action from CN Application No. 201180011597.4, dated Jan. 6, 2015.
Office Action from Chinese Patent Application No. 201180011597.4 dated Jun. 3, 2015.
Office Action for Chinese Patent Application No. 201180038844.X, dated Jun. 8, 2015.
European Search Report from European Application No. EP 15151426.2, dated Jun. 1, 2015.
Office Action from U.S. Appl. No. 12/818,290, dated Oct. 21, 2015.

* cited by examiner

MONITOR FOR FRONT TERMINAL BATTERIES

CROSS-REFERENCE TO RELATED APPLICATION

The present application is based on and claims the benefit of U.S. provisional patent application Ser. No. 61/309,977, filed Mar. 3, 2010, the content of which is hereby incorporated by reference in its entirety.

BACKGROUND OF THE INVENTION

The present invention relates to battery testers. More specifically, the present invention relates to battery testers of the type used to electronically monitor batteries.

Batteries are used in various applications, including "stationary" applications such as backup power supply applications. For example, remote cellular stations, electrical switching stations, hospitals, and many other installations require a source of backup power. In many such installations, it is important to ensure that the battery or batteries have not degraded and are capable of maintaining a desired amount of charge.

When testing a battery, a battery tester must be electrically coupled to terminals of the battery. This can be particularly time consuming if the battery has terminals that are not easily accessible. In such a situation, a technician may be required to physically move the battery in order to gain access to the terminals. There is an ongoing need to improve testing techniques of stationary batteries.

SUMMARY OF THE INVENTION

A battery monitoring device configured to monitor a storage battery includes terminals and a battery tester module configured to mount to the terminals with Kelvin connectors. A data connection is configured to communicate with another battery module.

DETAILED DESCRIPTION OF ILLUSTRATIVE EMBODIMENTS

The present invention provides a technique to test a stationary battery without removing the battery from its storage compartment. The present invention also reduces the amount of wiring required for coupling each individual electronic battery tester to a receiving station. Further, the present invention provides accommodations so that existing battery hardware does not have to be removed or re-designed in order to facilitate installation of the battery monitoring device. Other aspects of the present invention include Kelvin connectors configured to couple to terminals on a side of a battery, providing a battery monitor which mounts to a battery with a tester access point, providing a battery monitor which mounts to a battery with a network or databus connection, providing a battery monitor which mounts to a battery and includes a temperature sensor or providing a battery monitor which mounts to a battery which includes a phase change material and optionally including some type of temperature monitoring of the phase change material.

In one aspect, the present invention addresses the difficulties presented above by providing a battery monitoring device that is configured to provide battery test data to a control location over a data connection medium in a chain-like configuration. A daisy chain is one type of a chain-like configuration and refers to a configuration in which data is transmitted between serially connected modules. Thus, under one daisy chain configuration, a first electronic battery tester connects to a second electronic battery tester, which, in turn, connects to an optional third electronic battery tester, which then connects to an optional fourth electronic battery tester, and so on. At least one of the electronic battery testers in the daisy chain can communicate the battery test data to a receiving station at a central location.

In one example embodiment, battery test data is generated and transmitted to a central monitoring station such as a computer. In another example embodiment, battery test data is generated and calculations are performed using the battery test data prior to transmission of the calculations to the central monitoring station.

A battery installation that utilizes an embodiment of the present invention is described below in connection with FIG. 1. More detailed example embodiments are described in connection with FIGS. 2 through 6.

Figure 1:
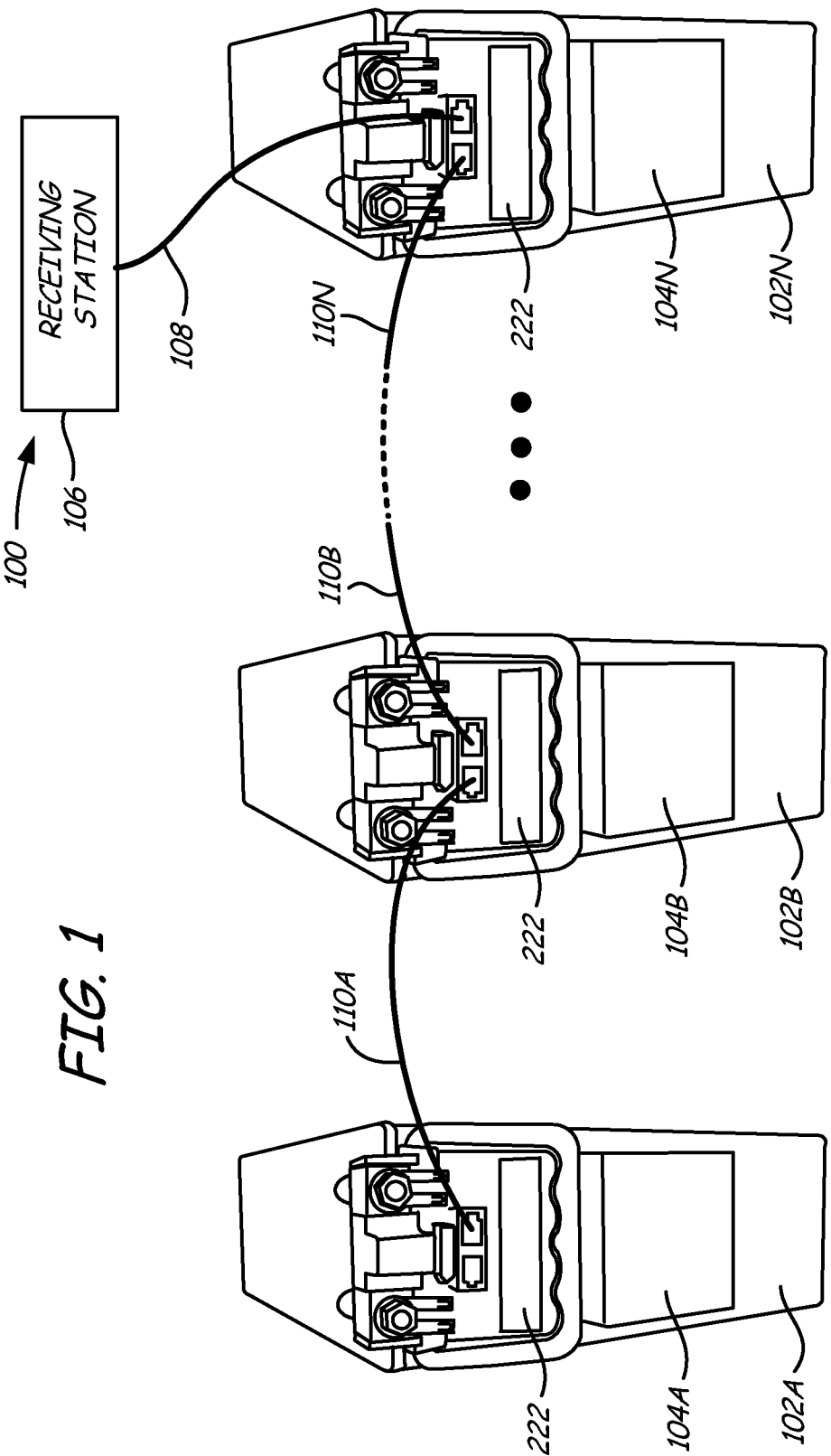
FIG. 1 is a simplified diagram showing batteries and battery test modules.

FIG. 1 is a simplified block diagram of a battery installation 100 including a plurality of batteries 102A, 102B . . . 102N. Each battery 102A . . . 102N is electrically coupled to a respective battery tester 104A, 104B . . . 104N over data connections 110A . . . 110N in a chain-like fashion. Thus, battery tester 104A communicates over data connection 110A with battery tester 104B, which, in turn, communicates over an optional data connection 110B with an optional battery tester 110N, and so on. At least one of the battery testers 104A . . . 104N in the chain-like configuration communicates over a communication medium 108 with a data receiving station 106.

Figure 2:
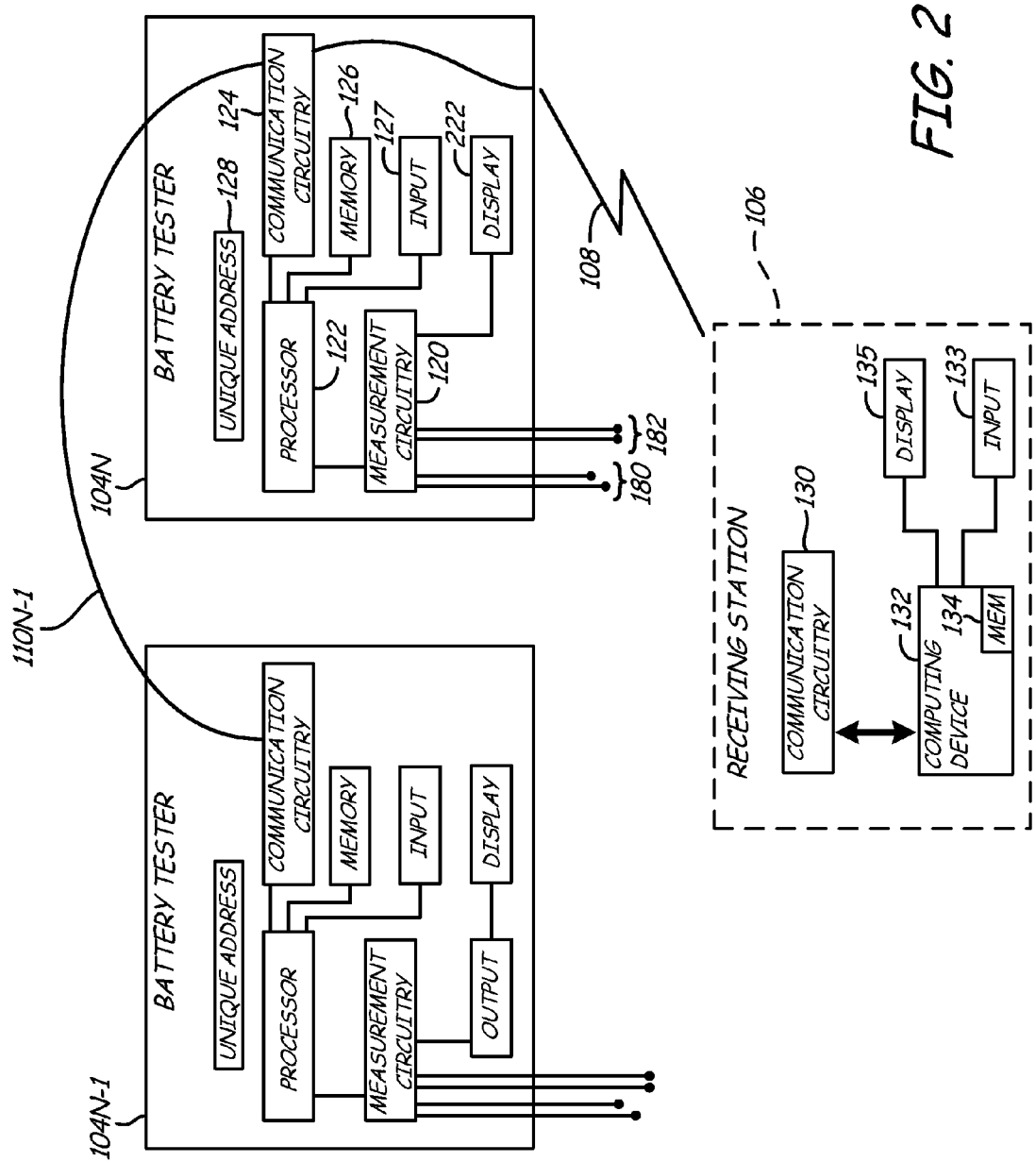
FIG. 2 is a simplified block diagram of the battery test modules of FIG. 1.

FIG. 2 is a simplified block diagram of battery testers 104N-1 . . . 104N and receiving station 106 used in the battery installation of FIG. 1. As can be seen in FIG. 2, each battery tester 104N-1 . . . 104N can be identified by a unique address 128. Battery tester 104N communicates with the receiving station 106 via communication medium 108. In FIG. 2, battery tester 104N is illustrated as including a unique address 128. This can be stored, for example, in memory 126. An input 127 is provided for local input, if desired. Communication circuitry 124 is configured to communicate with another battery tester or with a remote receiving station. The microprocessor 122 communicates with measurement circuitry 120 and operates in accordance with instructions stored in memory 126. A local output can be provided using display 222. Measurement circuitry 120 couples to storage battery 102 through Kelvin connections 180 and 182.

In FIG. 2, receiving station 106 is illustrated as including communication circuitry 130 and computing device 132. The communication circuitry 130 is used to couple to communication link 108 and can be configured within receiving station 106 or can be a module which can be selectively coupled to station 106. For example, communication circuitry 130 can comprise a device which couples to a USB port of a computer, etc. A computing device 132 can be a uniquely configured device or, for example, may be embodied in a desktop or portable computer. A computing device 132 operates in accordance with instructions stored in memory 134 and can receive local input through input 133. Similarly, a display 135 is provided for providing a local output.

Communication medium 108 can be any type of communication link. Thus, communication medium 108 can be a radio frequency link, an infrared link, a wired link, etc.

As mentioned above, the configuration of the present invention reduces the amount of wiring required for coupling individual battery testers to the receiving station. The particular measurement circuitry can perform any type of battery test, including tests which are based upon impedance, conductance, voltage, resistive loading, either static or dynamic parameters, etc.

A battery tester 104 is installed on each battery and couples each battery to one another. Battery tester 104N transmits data to the receiving station 106. The transmission can be periodic, or can be based upon polling of receivers, which can be implemented in communication circuitry 124. When used in a periodic basis, battery tester 104N can be maintained in a sleep mode and wake up, as desired, to obtain a battery test data reading, and broadcast the results. As mentioned above, the transmission can include identification information (such as a unique identification 128 for each tester or a serial number of the battery), which uniquely identifies the battery tester that performed the test or battery from which the battery test information was obtained. In some embodiments, this information is not necessary.

Figure 3:
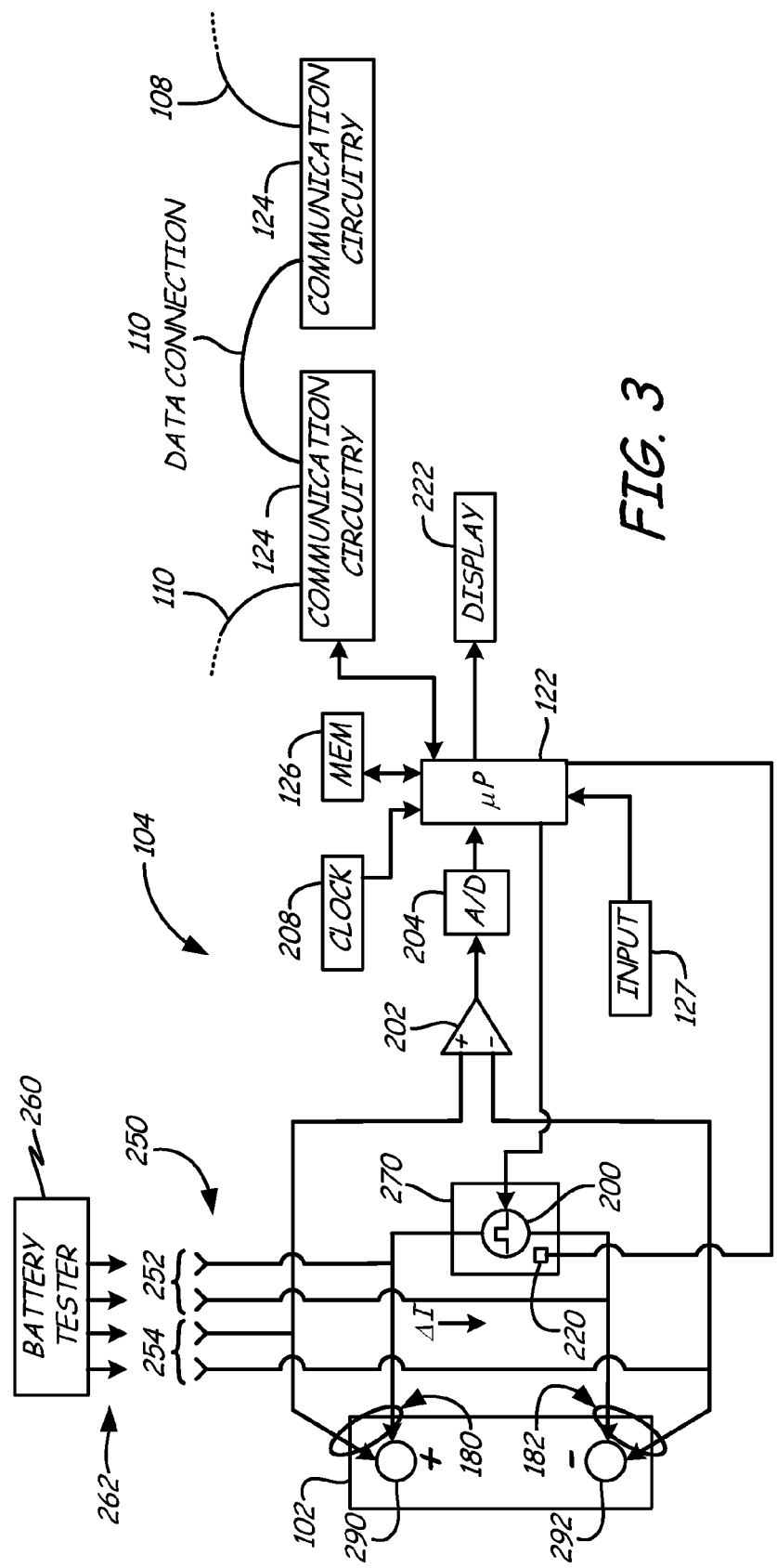
FIG. 3 is a simplified schematic diagram of a battery test module.

FIG. 3 is a block diagram of battery tester 104 in accordance with a specific embodiment of the present invention. Battery tester 104 is shown coupled to battery 102, which includes a positive battery terminal and a negative battery terminal through Kelvin connectors 180 and 182, respectively. Battery tester 104 includes a forcing function source 200, differential amplifier 202, analog-to-digital converter 204 and microprocessor 122. Amplifier 202 is coupled to battery 102. Amplifier 202 has an output connected to an input of analog-to-digital converter 204. Microprocessor 122 is connected to system clock 208, memory 126 and analog-to-digital converter 204. Microprocessor 122 is also capable of receiving an input from input device 127. Microprocessor 122 also connects to communication circuitry 124 and an output device such as display 222.

Figure 4:
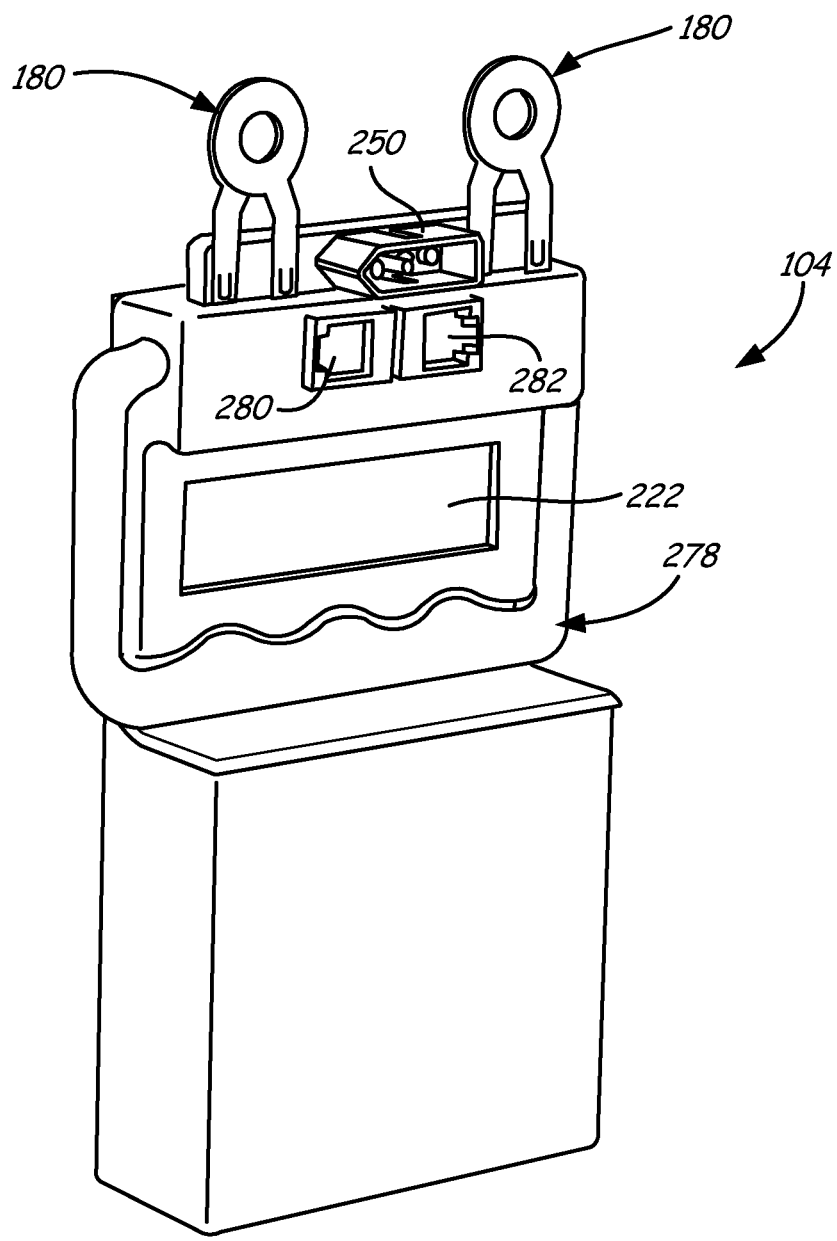
FIG. 4 is a perspective view of the battery test module.

In operation, forcing function source 200 is controlled by microprocessor 122 and provides forcing function signal (current AI in the direction shown by the arrow) in FIG. 4. In one embodiment, this is a square wave, pulse or other signal with a time varying component including a periodic or transient signal. The forcing function source 200 can be an active source in which a forcing function signal is injected into battery 102, or can be a passive source such as a load. Differential amplifier 202 is connected to the terminals 290,292 of battery 102 and provides an output related to the voltage potential difference between the terminal 290, 292 to the analog-to-digital converter 204. In a preferred embodiment, amplifier 202 has a large input impedance. Amplifier 202 can also be used to measure the potential voltage (VBAT) of battery 102.

Tester 104 is connected to battery 102 through a four-point connection technique known as a Kelvin connection. This Kelvin connection 180, 182 allows current AI to be injected into battery 102 through a first pair of terminals in connections 180 and 182 while the voltage V across the battery 102 is measured by a second pair of terminals in connections 180 and 182. Because only a small amount of current flows through amplifier 202, the voltage drop across the inputs to amplifier 202 is substantially identical to the voltage drop across the terminals of the battery 102. The output of differential amplifier 202 is converted to a digital format and is provided to microprocessor 122. Microprocessor 122 operates at a frequency determined by system clock 208 and in accordance with programming instructions stored in memory 126.

During operation, microprocessor is configured to measure a dynamic parameter of battery 102 by measuring a response to a forcing function signal applied by forcing function source 200. The forcing function source 200 can be an inactive source or it can be a passive source in which a load is applied to the battery 102. The forcing function has a time varying component and can be a transient signal. Example dynamic parameters include dynamic conductance, resistance, impedance, admittance, susceptance, etc.

FIG. 3 also illustrates a tester access point 250 which provides Kelvin connections to a forcing function access point 252 and a response access point 254. Access point 250 is configured such that a separate battery tester, such as a portable batter tester, can be plugged into the tester 104 and perform separate battery tests on battery 102 using Kelvin connectors 180 and 182. For example, battery tester 260 can include a plug 262 which is configured to electrically couple access point 250. Plug 262 includes Kelvin connections which couple to connections 254 and 252. The battery tester 260 may operate in accordance with any appropriate technology and might function in a manner similar to that described in connection with battery tester 104. In another configuration, element 260 comprises a battery charger in which a charge signal can be applied to the battery 102 through access point 250.

In some configuration, forcing function source 200 may draw a sufficiently large enough current to produce substantial heating. In such a configuration, a phase change material 270 can be used. For example, a phase change material 270 can surround forcing function source 200 and thermally coupled to forcing function source 200. As described in co-pending application entitled BATTERY MAINTENANCE DEVICE WITH THERMAL BUFFER, Ser. No. 12/818,290, filed Jun. 18, 2010, by Kevin Bertness, which is incorporated by reference in its entirety. The phase change material 270 provides a nonlinear relationship between the amount of heat material 270 can absorb relative to the temperature of the phase change material 270. For example, if phase change material 270 comprises paraffin wax or the like, the material 270 will absorb heat while the paraffin transitions to a solid state from a liquid state without changing temperature. A temperature sensor 220 can be placed proximate phase change material 270 and used to monitor the temperature of material 220. The temperature sensor 270 can be coupled to microprocessor 122 whereby microprocessor 122 reduces the current flow AI through forcing function source 200 if the temperature exceeds a threshold. The current AI can be reduced or completely shut off. The temperature sensor 220 can be contacting type temperature sensor, for example, a thermocouple, thermistor, RTD, active semiconductor element, etc. However, sensor 220 may also be a non-contact sensors such as an infrared sensor. In one configuration, element 220 is a thermal fuse place in or adjacent to the phase change material 270. This can be a resettable PTC (positive temperature coefficient) type fuse placed in series with the forcing function source 200.

Many stationary batteries now have terminals which are positioned on the front or side of the battery housing. Such configurations are increasingly popular in stationery power applications such as un-interrupted power supplies and telecommunication systems. Although some such front terminal batteries also have terminals which are accessible from the top of the battery, the terminals are generally not readily accessible and there is insufficient rom to place a battery monitor. The present invention provides a battery monitor that can be easily retrofitted onto existing strings of batteries without having to remove the battery from the location (such as a storage cabinet) in which it is stored.

FIG. 4 is perspective view of battery monitor 104. The circuitry shown in FIG. 3 can be housed in battery monitor housing 278. Kelvin connectors 180 and 182 extend from housing 278 and are configured to mount to the terminals of a battery. Access point 250 is positioned near a top portion of the housing 278 for easy access by an operator. Daisy chain connectors 280 and 282 are positioned on a front of the housing 278. In the configurations shown in FIG. 4, the connectors 280 and 282 are shown as connectors which allow easy removal of a network connections such as an RJ-45 or RJ-11 type connector. Display 222 is shown on the front of housing 278. The display 222 can include a manual input, for example, to a touch screen display or other configuration.

Figure 5:
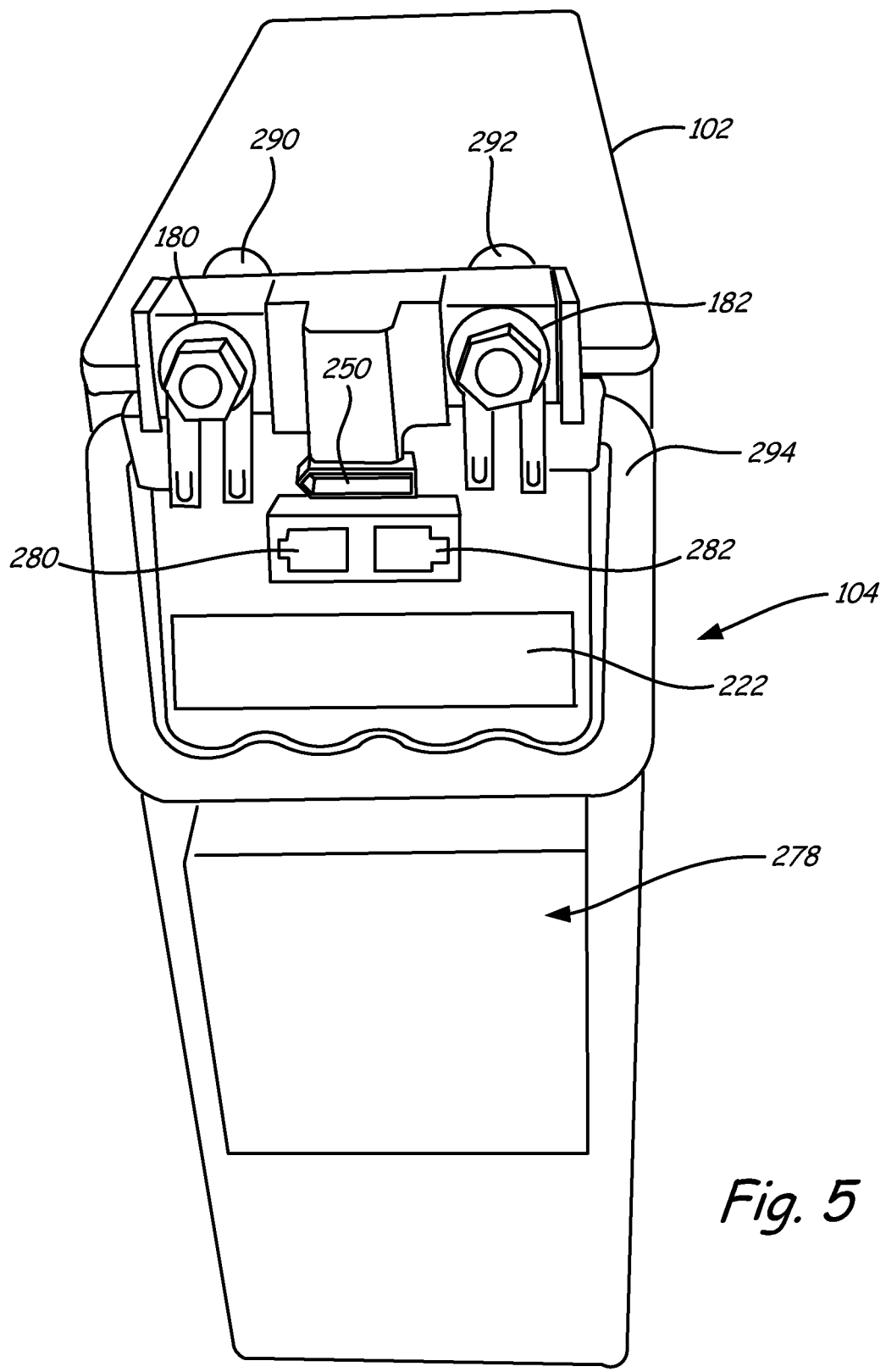
FIG. 5 is a perspective view of the battery test module coupled to a battery.

FIG. 5 is perspective view of battery monitor 104 mounted to storage battery 102. As illustrated in FIG. 5, Kelvin connectors 180 and 182 are mounted to battery terminals 290 and 292. Note that in this configuration, a handle 294 of the battery 102 remains accessible and can be used by an operator to lift or move the storage battery 102.

Figure 6:
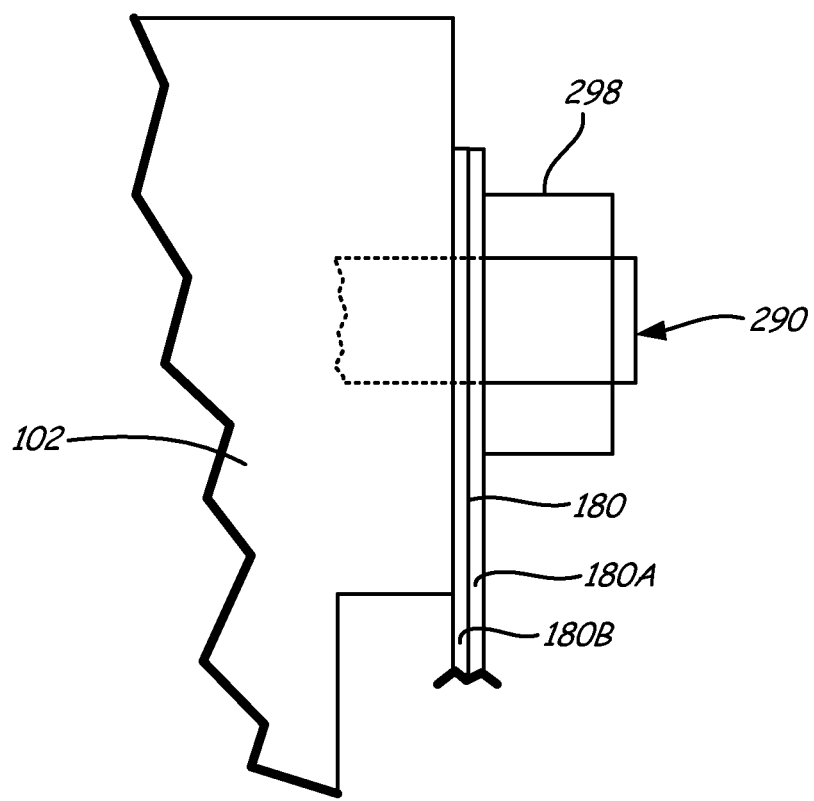
FIG. 6 is a side cross sectional view of a Kelvin connector coupled to a battery.

FIG. 6 is a side cross sectional view of a portion of battery 102 showing battery terminal 290 and Kelvin connector 180. As illustrated in FIG. 6, the Kelvin connector 180 is formed by two separate layers 180A and 180B. Layers 180A and 180B are of a conductive material and separated by an insulator to thereby provide a Kelvin connector to terminal 290. Terminal 290 is threaded and a nut 288 used to secure the Kelvin connector 180 to the terminal 290. This coupling also physically secures the housing 278 of battery tester 104 to the housing of battery 102. Other Kelvin connection configuration can also be employed. For example, the ring of the Kelvin connectors 180, 182 which couples to the terminals 290, 292 can have one conductor which extends partway around the circumference of the ring, while a second conductor extends around at least some of the remaining portion of the ring.

One problem associated with prior art configurations is that when a different tester such as a handheld tester is used to test a storage battery, the result of the battery test may differ from the test obtained with the battery monitor. One source of this difference is that the connection point to the battery terminals is different. In one aspect, the present invention reduces this difference by providing the access point 250. Using access point 250 a separate battery tester 260 shown in FIG. 3 can be coupled to the terminals 290 and 292 of battery 102 using the same physical connection provided by Kelvin connectors 180 and 182. Access point 250 can be any appropriate physical connector configuration which preferably provides a low resistance conductive path. Each of the battery test modules 104 can communicate with the system in a number of ways. In one low cost embodiment, the modules are connected in a daisy chain fashion through a modular style connector. The connectors are preferably optically isolated from the battery potential as strings of battery may typically provide relatively high voltages, for example 480 volts. Other daisy chain configurations can be used including fiber optic configurations. Individual monitors may also be wired directly back to a centralized location through any type of isolated means including Ethernet, fiber optic, etc., including other communication techniques including radio frequency (RF) communication including Zigbee®, Bluetooth®, Wi-Fi, Cellular, etc.

Although the present invention has been described with reference to preferred embodiments, workers skilled in the art will recognize that changes may be made in form and detail without departing from the spirit and scope of the invention. The Kelvin connectors described herein are configured to be secured to the terminals in the battery in a manner which provides sufficient strength to mount the battery to the battery. Further, the Kelvin connectors are configured to ridgedly support the battery tester module. This support may be through the Kelvin connectors themselves or through additional strengthening materials. This is in contrast to with some prior art designs in which the Kelvin connectors are moveable with respect to the battery tester. Although a unique address stored in memory is described, in another configuration the units can "self address" themselves based upon their position in the string of units. For example, as data is passed through the string, each unit appends its data to the end of the transmission received from the previous module. Then, at the central location, the data can be parsed and associated with the correct module. In such a configuration, if a module is replaced, no addresses need to be modified. In another aspect, the modules are configured to test the "intercell" connections between adjacent batteries. In this configuration, an additional connection can be provided between a module and an adjacent battery to apply a forcing function signal. The voltage difference between the voltage across the intercell connection and the voltage across the battery terminals (or across the battery and the intercell connection) can be used to identify a faulty intercell connection. Such a connection can be provided separately, or, for example, can be carried in connectors 110 shown in FIG. 1.

What is claimed is:

1. A battery tester module configured to monitor a storage battery, comprising:
    a battery tester housing configured to house circuitry of the battery tester module and couple to the storage battery;
    Kelvin connections configured to couple to terminals of the storage battery and affixed to the housing;
    battery test circuitry configured to perform a battery test on the storage battery through the Kelvin connections;
    a first data connection configured to directly communicate with a second battery tester module affixed to a second storage battery;
    a second data connection only on the battery tester module and configured to communicate data from each of the battery tester module and the second battery tester module, wherein the second data connection comprises a wired connection; and
    a tester access point including a forcing function access point and a response access point that are directly connected to the Kelvin connections, and a plug interface configured to receive a plug of an external battery tester and connect the external battery tester to the forcing function access point and the response access point.

2. The battery tester module of claim 1, wherein the battery tester module includes a microprocessor configured to compute a battery test result.

3. The battery tester module of claim 1 including a forcing function source coupled to the Kelvin connectors and wherein the measurement data relates to a dynamic parameter of the battery.

4. The battery tester module of claim 1 wherein the second data connection is configured to transmit data from the battery tester module and the second battery tester module to a third battery tester module.

5. The battery tester module of claim 1 wherein the second data connection is configured to communicate data from the battery tester module and the second battery tester module to a receiving station.

6. The battery tester module of claim 1 including a phase change material configured to receive heat from circuitry of the battery tester module.

7. The battery tester module of claim 6 including a temperature sensor configured to measure a temperature of the phase change material.

8. The battery tester module of claim 7 wherein circuitry of the battery tester module is controlled based upon a sensed temperature of the change material.

9. The battery tester module of claim 1 wherein the Kelvin connectors comprise first and second rings each having first and second connectors, the first and second rings configured to mount to the terminals of the storage battery.

10. The battery tester module of claim 1 including a display configured to display information.

11. A receiving station configured to couple to the battery tester module of claim 1 to receive data through the second data connection from the battery tester module.

12. The receiving station of claim 11 further configured to receive data from the second battery tester module.

13. The battery test module of claim 1 including an electrical connection to a terminal of an adjacent battery and wherein the battery test circuitry is configured to test an intercell connection.

14. The battery tester module of claim 1, wherein the forcing function access point includes a pair of conductors and the response access point includes a pair of conductors.

15. The battery tester module of claim 14, wherein the conductors of the forcing function access point and the response access point include terminating ends within a socket of the plug interface.

16. The battery tester module of claim 14, wherein the tester access point is positioned between the Kelvin connections.

17. The battery tester module of claim 16, wherein:
the battery tester module includes a display configured to display information, the display located on a first side of the housing; and
the tester access point is on the first side of the housing.

18. A method for measuring parameters of a plurality of storage batteries, comprising:
measuring a parameter of a first storage battery with a first battery test module mounted to a first storage battery;
transmitting the measured first parameter directly from the first battery test module to a second battery test module mounted to a second storage battery and including Kelvin connectors attached to terminals of the second storage battery;
measuring a second parameter of the second storage battery using the second battery test module through the Kelvin connectors;
transmitting each of the first measured parameter and the second measured parameter only from the second battery tester module to a receiving station through a wired connection; and
providing a tester access point in the second battery test module configured to provide an external connection to the Kelvin connectors.

19. The method of claim 18 including applying a forcing function to the first storage battery through Kelvin connectors and measuring a dynamic parameter of the first storage battery.

20. The method of claim 18 including providing a phase change material configured to receive heat from circuitry of the second battery test module.

21. The method of claim 18 including coupling to the first storage battery with Kelvin connectors comprising first and second rings each having first and second connectors, the first and second rings configured to mount to the terminals of the first storage battery.

22. The method of claim 18, including connecting a third battery test module to the Kelvin connectors through the tester access point of the second battery test module, and performing a battery test on the second storage battery using the third battery test module through the Kelvin connectors.

23. The method of claim 22, wherein connecting a third battery test module to the Kelvin connectors through the tester access point of the second battery test module comprises coupling a plug of the third battery test module to the tester access point.

* * * * *